United States Patent [19]

Kendall

[11] Patent Number: 5,508,518
[45] Date of Patent: Apr. 16, 1996

[54] LITHOGRAPHY TOOL WITH VIBRATION ISOLATION

[75] Inventor: Rodney A. Kendall, Fairfield County, Conn.

[73] Assignee: International Business Machines Corporation, Armonk, N.Y.

[21] Appl. No.: 434,100

[22] Filed: May 3, 1995

[51] Int. Cl.⁶ .................................................. G21G 5/00
[52] U.S. Cl. ........................................ 250/492.2; 378/34
[58] Field of Search ........................... 250/492.2, 492.1, 250/492.3, 310, 440.11, 442.11; 378/34, 35, 201

[56] References Cited

U.S. PATENT DOCUMENTS

| | | | |
|---|---|---|---|
| 4,352,643 | 10/1982 | Iijima | 417/313 |
| 4,803,712 | 2/1989 | Kembo et al. | 250/492.2 |
| 4,952,858 | 8/1990 | Galburt | 318/647 |
| 5,308,036 | 5/1994 | Olson et al. | 248/638 |

*Primary Examiner*—Bruce C. Anderson
*Assistant Examiner*—Kiet T. Nguyen
*Attorney, Agent, or Firm*—Whitham, Curtis, Whitham & McGinn; Charles W. Peterson, Jr.

[57] ABSTRACT

The optical components of an imaging or exposure tool are isolated from vibrations emanating from components such as vacuum pumps, stage drives, and substrate translating and handling components, by connecting all sources of vibrations to the frame, and suspending the optical components from the frame using isolating and damping components. Connections to portions of the optical components are made using high vacuum, heavily damped, bellows type connectors, or the like.

10 Claims, 1 Drawing Sheet

LITHOGRAPHY TOOL WITH VIBRATION ISOLATION

BACKGROUND OF THE INVENTION

1. Field of the Invention

The invention is generally related to an isolation technique which prevents vibrations from the X-Y stages, substrate handling systems, vacuum systems, and ground frame of a lithography tool from adversely impacting on the performance of the exposure module.

2. Description of the Prior Art

Lithography tools typically have the exposure system (e.g., electron column for an E-beam lithography system), X-Y stages for masks and/or substrates, the substrate and mask handling systems, and the vacuum systems all mounted on a common isolation plate. The isolation plate is supported in such a way as to prevent floor vibration from reaching critical parts of the lithography tool. This prior art arrangement does not prevent vibrations generated by the X-Y stages and stage drivers, the substrate and mask handling systems, and the vacuum systems from being transmitted to the exposure system and adversely impacting on throughput and performance. In order to properly expose a substrate or film, such as a photoresist material or the like, all subsystems must be idle or mechanically quiet, otherwise, the tool vibrations will cause a degradation in pattern placement accuracy.

Early generation E-beam tools are typically operated at very slow rates of speed. Vibration problems have traditionally been handled by allowing a sufficient time period for the vibrations in the subsystems to dampen down to an acceptable level before proceeding with further exposure processes. However, with the later generation scanning and reduction-projection E-beam lithography systems, throughput is an important concern. It would be advantageous to provide a lithography tool with a vibration isolation scheme that provides complete isolation of the exposure system, and allows other operations such as high speed stage motions and substrate handling operations to be performed simultaneously with the lithography.

U.S. Pat. No. 4,352,643 to Iijima discloses isolation of vibrations produced by a vacuum pump from being transmitted to a vacuum apparatus, such as an E-Beam exposure apparatus, electron microscope, or the like. In Iijima, the pump is suspended from the main chamber using a bellows. The pump rides on a guide rail and utilizes the bellows as the fulcrum of a pendulum. Thus, in operation, reciprocating movement of pistons in the pump cause the pump to ride on the guide rail in a pendulum fashion, and the bellows prevents the vibrations from being transmitted to the main portion of the apparatus. The Iijima reference fails to recognize that a majority of vibrations in a E-Beam lithography apparatus are caused by movement of the masks and wafers, and movement of the stages, and Iijima makes no provisions to dampen these vibrations. Rather, as with other prior art systems discussed above, Iijima relies only on vibration insulators positioned on a common plane with the remaining subsystems. As explained above, these vibration insulators will only isolate the tool from floor vibrations.

U.S. Pat. No. 4,952,858 to Galburt discloses a microlithographic apparatus which can be used for imaging and/or inspection wherein the motor element is decoupled from the stage using a magnetic coupling arrangement wherein the monolithic stage is floating in space above the sub-stage. Galburt mounts most components on a common stage which are isolated from the floor using spring isolators.

U.S. Pat. No. 5,308,036 to Olson et al. discloses a stand for a microscope wherein vertical vibrations are prevented from being transmitted from one leg to another using damping materials at the base of each leg.

SUMMARY OF THE INVENTION

It is an object of this invention to provide an improved vibration isolation system for a lithography tool that completely isolates the exposure sub-system from the floor as well as other sub-systems, and allows a higher throughput.

It is another object of this invention to provide a lithography tool with a means for isolating the exposure sub-system from vibrations emanating from the floor, the substrate/mask handling subsystem, the vacuum pumps, the stage drive components, and the X-Y stages. According to the invention, the exposure module or sub-system of a lithography tool is isolated from vibrations emanating from both the floor, and the various other modules or sub-systems within the tool. Vibration isolation allows simultaneously performing lithography operations with high speed stage motions and/or substrate handling operations; thereby, dramatically increasing the throughput of the lithography tool.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1:
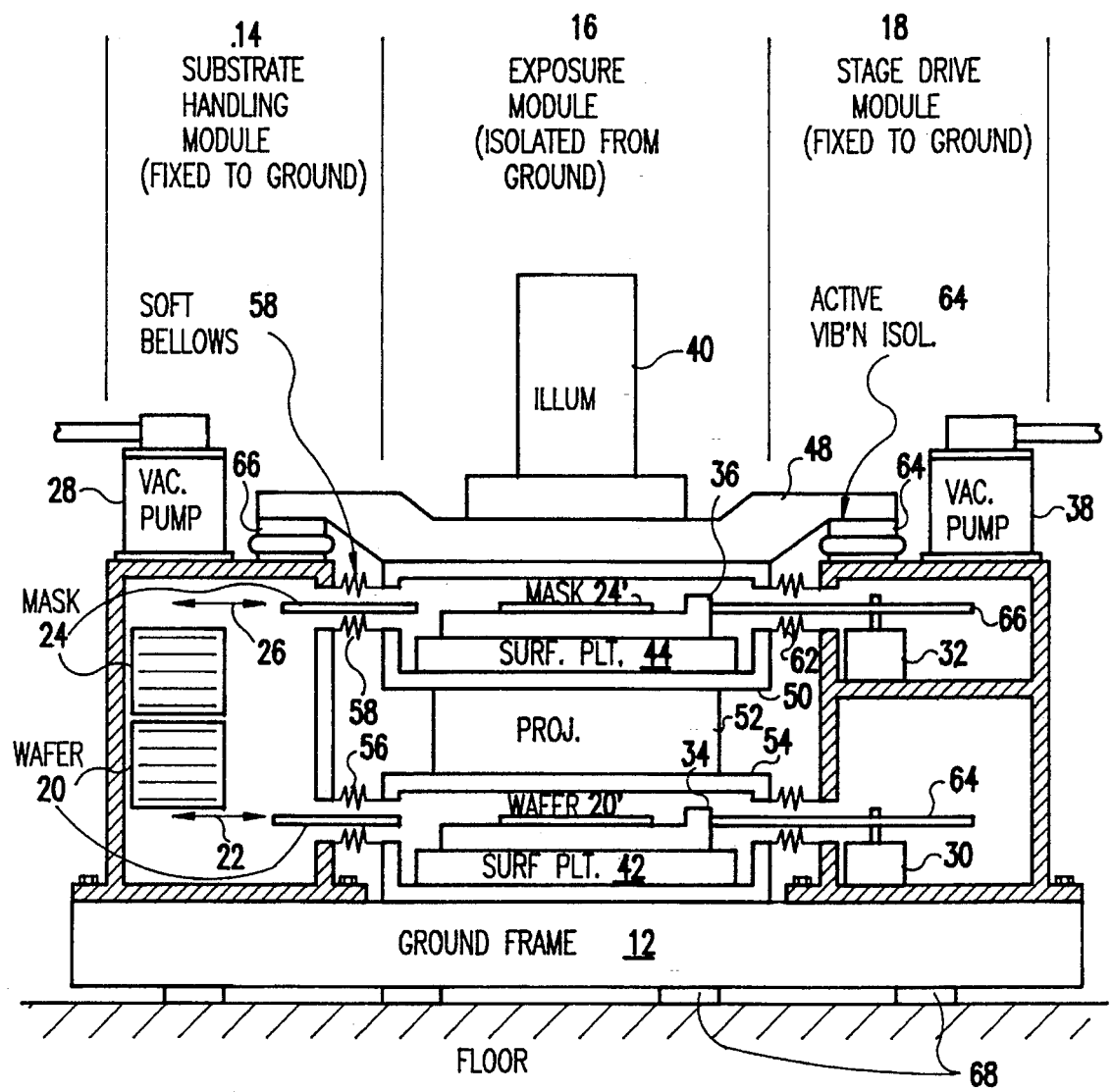
FIG. 1 is a cross-sectional side view of an E-Beam lithography tool which includes the vibration isolating configuration of the present invention.

FIG. 1 shows an E-beam lithography tool 10 with the vibration isolation configuration of the present invention. The E-beam lithography tool 10 can advantageously be a reduction-projection or scanning E-beam system. However, it should be understood that this invention is not limited E-beam lithography. For example, the vibration isolation configuration can also be used with other lithography tools, such as optical tools or the like, as well as inspection tools, such as electron microscopes or the like. The chief objective of the present invention is to isolate the optical components of the tool 10 from vibrations from the floor as well as vibrations produced by moving and/or vibrating components used in the tool itself.

The tool 10 includes a ground frame 12 which supports a substrate handling module 14, an exposure module 16, and a stage drive module 18. The important feature of this invention is that the optical subsystem referred to as the exposure module 16 is isolated from the ground, while the substrate handling module 14 and stage drive module 18, which both include sources of vibration, are connected to ground. For example, the substrate handling module 14 includes means for moving wafers 20 in and out of the exposure module 16 as indicated by double ended arrow 22, and means for moving masks 24 in and out of the exposure module 16 as indicated by double ended arrow 26. In addition, vacuum pump 28 is connected to the substrate handling module 14. The means for moving wafers 22, the means for moving masks 24, and the vacuum pump 28 are each connected to ground frame 12 such that vibrations from these components can be directed to ground. Likewise, the stage drive module 18 includes servo motors 30 and 32 for driving the X-Y stages 34 and 36 that move the wafers 20' and masks 24', respectively, within the exposure module 16. In addition, vacuum pump 38 is connected to the stage drive module 18. The servo motors 30 and 32, and the vacuum pump 38 are each connected to the ground frame 28 such that vibrations from these components are directed to ground.

By contrast, the exposure module 16, which includes all the optical components needed for lithography, inspection, or the like, is completely isolated from the ground frame 12. FIG. 1 shows an E-beam lithography tool 10 wherein the exposure module 16 comprises an electron column 40, stage plates 42 and 44 for the X-Y stages 34 and 36 for the wafer 20' and mask 24', respectively, and the metrology flamework which includes a suspending member 48, a mask compartment 50, a projection sub-unit 52, and a wafer compartment 54.

Bellows 56 and 58 allow wafers 20 and masks 24 to be inserted into and withdrawn from the wafer compartment 54 and the mask compartment 50, respectively. The bellows are preferably made of stainless steel, polymers, or some other suitable material, and are preferably corrugated such that vibrations from the substrate handling module 14 are not transmitted to the exposure module 16 during movement of the wafers 20 and masks 24 into the wafer compartment 54 and mask compartment 50, respectively. Bellows 60 and 62 allow the X-Y stages 42 and 44 to be controlled within the wafer compartment 54 and mask compartment 50, respectively, by servo motors 30 and 32, using drive arms 64 and 66, or the like. The bellows 60 and 62 are preferably made from similar materials to those described in conjunction with bellows 56 and 58, and have a similar corrugated configuration. The bellows 56, 58, 60, and 62 provide high vacuum connections between the exposure module 16 and adjacent modules 14 and 18, and are heavily damped to prevent vibrations from being transmitted to said exposure module 16 from the substrate handling module 14 or stage drive module 18.

Interposed between the suspending member 48 and the frame portions of the substrate handling module 14 and stage drive module 18 are vibration isolation components 64 and 66. The isolation components 64 and 66 serve to prevent mechanical vibrations from being transmitted to the exposure module. The isolation components can be of the type which are commercially available from Barry Controls, Newport, or Integrated Dynamics Engineering.

Vibrations emanating from ground, such as those that are transmitted along a factory floor, can be dissipated by vibration damping devices 68 which can be rubberized pads or the like. However, because the exposure module 16 is isolated from ground as described above, vibration damping from ground sources is not required.

While the invention has been described in terms of its preferred embodiments, those skilled in the art will recognize that the invention can be practiced with modification within the spirit and scope of the appended claims.

I claim:

1. A particle beam lithography arrangement, comprising:

a substrate handling module fixedly mounted on one side of a ground frame;

a stage drive module fixedly mounted on another side of said ground frame;

a particle beam exposure module suspended between said substrate handling module and said stage drive module; and means for dampening movement of said exposure module relative to said ground frame.

2. A lithography or inspection tool, comprising:

a frame;

an optical subsystem;

a means for isolating said optical subsystem from vibrations emanating from said frame, said means for isolating vibrations being positioned between said frame and said optical subsystem; and at least one source of vibration connected to said frame, whereby vibrations from said source of vibration are isolated from said optical subsystem by said means for isolating.

3. The lithography or inspection tool of claim 2 wherein said at least one source of vibration is selected from the group consisting of vacuum pumps, stage drives, means for translating masks, and means for translating wafers.

4. The lithography or inspection tool of claim 3 wherein said one source of vibration is a vacuum pump.

5. The lithography or inspection tool of claim 3 wherein said one source of vibration is a stage drive.

6. The lithography or inspection tool of claim 3 wherein said one source of vibration is a means for translating masks.

7. The lithography or inspection tool of claim 3 wherein said one source of vibration is a means for translating wafers.

8. The lithography or inspection tool as recited in claim 2 wherein said means for isolating comprises:

a means for suspending said optical subsystem from said frame; and first isolation means interposed between said frame and said means for suspending.

9. The lithography or inspection tool as recited in claim 8 wherein said means of isolating further comprises a mask compartment and a substrate compartment connected to said optical subsystem, said mask compartment and said substrate compartment each including a stage for movement of a mask within said mask compartment and for movement of a substrate within said substrate compartment, respectively;

means for moving said stage in said mask compartment is connected to said frame and projected into said mask compartment;

means for moving said stage in said substrate compartment is connected to said frame and projected into said substrate compartment; and second isolation means positioned between said frame and said optical subsystem, said second isolation means permitting access to said mask compartment for said means for moving said stage in said mask compartment and permitting access to said substrate compartment for said means for moving said stage in said substrate compartment.

10. The lithography or inspection tool of claim 9 wherein said second isolation means includes a plurality of bellows connected between said frame and said optical subsystem.

* * * * *